(12) United States Patent
Kirsch et al.

(10) Patent No.: US 6,385,742 B1
(45) Date of Patent: May 7, 2002

(54) MICROPROCESSOR DEBUGGING MECHANISM EMPLOYING SCAN INTERFACE

(75) Inventors: Graham Kirsch, Tadley (GB); Simon Martin Kershaw, San Jose, CA (US)

(73) Assignee: LSI Logic Corporation, Milpitas, CA (US)

( * ) Notice: Subject to any disclaimer, the term of this patent is extended or adjusted under 35 U.S.C. 154(b) by 0 days.

(21) Appl. No.: 09/262,816

(22) Filed: Mar. 5, 1999

(30) Foreign Application Priority Data

Mar. 6, 1998 (GB) ............................... 9804910
Jun. 10, 1998 (GB) ............................... 9812512

(51) Int. Cl.[7] ........................... G06F 11/28; G06F 9/455
(52) U.S. Cl. ......................................... 714/39; 712/227
(58) Field of Search .............................. 714/39, 34, 33, 714/25, 30, 726; 712/227, 244, 228, 35; 713/600, 601; 710/260, 266

(56) References Cited

U.S. PATENT DOCUMENTS 5,838,897 A * 11/1998 Bluhm et al.
6,035,422 A * 3/2000 Hohl et al.

FOREIGN PATENT DOCUMENTS

EP 0 849672 A2 6/1998
EP 0 854422 7/1998

* cited by examiner

*Primary Examiner*—Gopal C. Ray
(74) *Attorney, Agent, or Firm*—Conley, Rose & Tayon

(57) ABSTRACT

In order to smooth the entry into a debugging operation using a scan chain of registers in a microprocessor, a method for carrying out debugging procedures. The method comprises providing a processor with a chain of scan registers, a scan interface for interfacing with an external scan controller, a breakpoint interrupt mechanism for executing an interrupt instruction, and a processor clock control mechanism. The method includes detecting or generating a breakpoint in the operation of the processor. The breakpoint interrupt mechanism executes an interrupt instruction as a result of which the processor completes its current instruction, and signals the same to the scan interface. The scan interface asserts a Start Scan signal to the clock signal control mechanism, which whereupon stops the processor clock or clocks. The external scan controller is alerted to start a scan sequence.

11 Claims, 6 Drawing Sheets

MICROPROCESSOR DEBUGGING MECHANISM EMPLOYING SCAN INTERFACE

The present invention relates to a method and apparatus for carrying out debugging procedures on a processor, for example a microprocessor or Digital Signal Processing (DSP) processor.

Software debugging is commonly carried out using In Circuit Emulation (ICE) wherein a monitor program located in the microprocessor provides information to an external host.

It has been recognised that software debugging using ICE techniques may be carried out more expeditiously using techniques adapted from production testing of microprocessors with production scan-chains. Such production scan chains are to be distinguished from boundary scan registers as in the known JTAG standards. In production scan chains, registers are provided throughout the processor so that the working of a software routine throughout the processor can be observed, i.e. it is "visible". Such production scan chain of registers can be loaded with a random pattern of logic values. One or more machine cycles may then be executed, and the logic values are fed into the microprocessor logic. The resultant logic values in the registers may then be uploaded and examined to assess whether the microprocessor logic is working correctly.

Referring now to FIG. 1 of the drawings, this shows a block diagram of a previously proposed technique for using an existing production test scan-chain in a microprocessor for software debugging. As shown in FIG. 1, a pipelined microprocessor 2 is coupled via an Address Bus 4 and Data Bus 6 to a program RAM 8. The Address Bus 4 is also coupled to a Breakpoint Detect Unit 10. A clock controller 12 is provided and a Scan Controller 14 external to the microprocessor controls the operation of the scan mode.

A chain of internal scan registers 16 is such that the state of the microprocessor is completely described in the registers. Further the registers may be accessed during normal operation of the microprocessor.

The method of software debug using a production scan-chain is referred to herein as Scan In-Circuit Emulation (ScanICE). ScanICE mode is entered whenever access is required to the internal processor state, such as on reaching a software breakpoint. FIG. 1 illustrates a previous approach to entering ScanICE mode where only breakpoints on program addresses are considered. A register in the Breakpoint Detect Unit 10 is initialised to the required breakpoint address. When a match occurs between the Program Address Bus 4 and this register, an Enter ScanICE signal on a line 18 is asserted. This triggers the Clock Controller 12 to halt appropriate clocks so that the off-chip Scan Controller 14 can initiate scanning. The Scan Controller 14 uses the Scan Enable and Test signals to configure registers in the scan-chain 16 to shift serially when clocked and supplies the Scan Clock.

Using the scanned-but data for observability and scanned-in data for controllability the controller 14 can provide all required facilities for debugging software running on the microprocessor. When ScanICE functions are complete, Leave Scan is asserted on a line 20 forcing the Clock Controller to restart clocks and resume normal operation. The approach of FIG. 1 for entering ScanICE mode suffers from a number of problems:

1. To ease software development it is often required that the microprocessor's pipeline is hidden from the programmer. This means that all registers'contents refer to the same instruction. In a processor with, for example, a data pipeline, simply stopping the clock will result in several instructions being in varying states of execution. This is illustrated in FIG. 2 for a simple multiplier data path. The pipeline is used to separate the operation of reading from memory and actually multiplying so that they can be carried out in parallel using the X and Y registers 22,24 as a temporary store (which are part of the production scan chain). For successive single-cycle multiply instructions, two instructions are being executed at any one time; the result of one is loaded into the product register 26 on a particular clock-edge and the data operands of the next are loaded into the X and Y registers 22,24. By simply stopping the clock the Host debugger will have great difficulty in separating the instructions with just the knowledge of what is held in the X, Y and Product registers.

2. It is often required that a processor be able to access slow-memory without using a very slow clock. One way of achieving this is to provide a wait-state mechanism whereby the processor is halted during the memory access. This is illustrated in FIG. 3. Following an access to a slow memory 30, a Memory Interface Unit 32 asserts a Wait signal and Clock Controller 12 stops the clock to the Microprocessor 2. Following a defined number of clocks of the Memory Interface Unit 32 (as monitored by a counter 34) the Wait signal is released and the clock to the Microprocessor is started again and normal operation resumes. When a breakpoint is detected, the Clock Controller must detect the fact that an access to slow memory is occurring and continue clocking the Memory Interface Unit to complete the access before stopping all clocks. This is an undesirable complication.

Depending on the functionality of the microprocessor, there are many other scenarios when just stopping the main clock and entering ScanICE may cause problems. These problems get more numerous as pipelines get more complex and more elaborate schemes are implemented for improving microprocessor performance.

SUMMARY OF THE INVENTION

The present invention provides apparatus for carrying out debugging procedures on a processor, the processor including a production scan chain of scan registers, scan interface means for interfacing with a scan controller means external of the processor, a breakpoint interrupt means for executing an interrupt instruction and a processor clock control means, wherein, when in the operation of the processor a breakpoint is detected or generated, the breakpoint interrupt means executes an interrupt, the processor completes its current instruction and then branches to a Interrupt Service Vector, completion of which is signalled to the scan interface means which provides a Start Scan signal to the clock control means, following'which the scan interface means signals the external scan controller to begin a scanning operation.

In a further aspect, the present invention provides a method for carrying out debugging procedures on a processor, the method comprising the following steps:

1) providing a processor with a production scan chain of scan registers, a scan interface means for interfacing with an external scan controller means, a breakpoint interrupt means for executing an interrupt instruction, and a processor clock control means;

2) detecting or generating a breakpoint in the operation of the processor;

3) the breakpoint interrupt means executes an interrupt instruction as a result of which the processor completes its current instruction, and signals the same to the scan interface means;

4) the scan interface means asserts a Start Scan signal to the processor clock control means, which whereupon stops the processor clock or clocks; and 5) the external scan controller means is alerted to start a scan sequence.

In accordance with, the invention, an improved technique is provided for entering an In Circuit Emulation session which avoids problems experienced in stopping the microprocessor clock without upsetting current actions of the microprocessor, and in recovering information of pipelined instructions.

Preferably, in the operation of the invention, after the microprocessor has completed its current instructions, the microprocessor pipeline is filled with no operation (NOP) instructions.

The present invention is particularly applicable to pipelined processors, especially DSP processor cores.

Brief Description of the Drawings

A preferred embodiment of the invention will now be described with reference to the accompanying drawings, wherein.

DESCRIPTION OF THE PREFERRED EMBODIMENT

Figure 1:
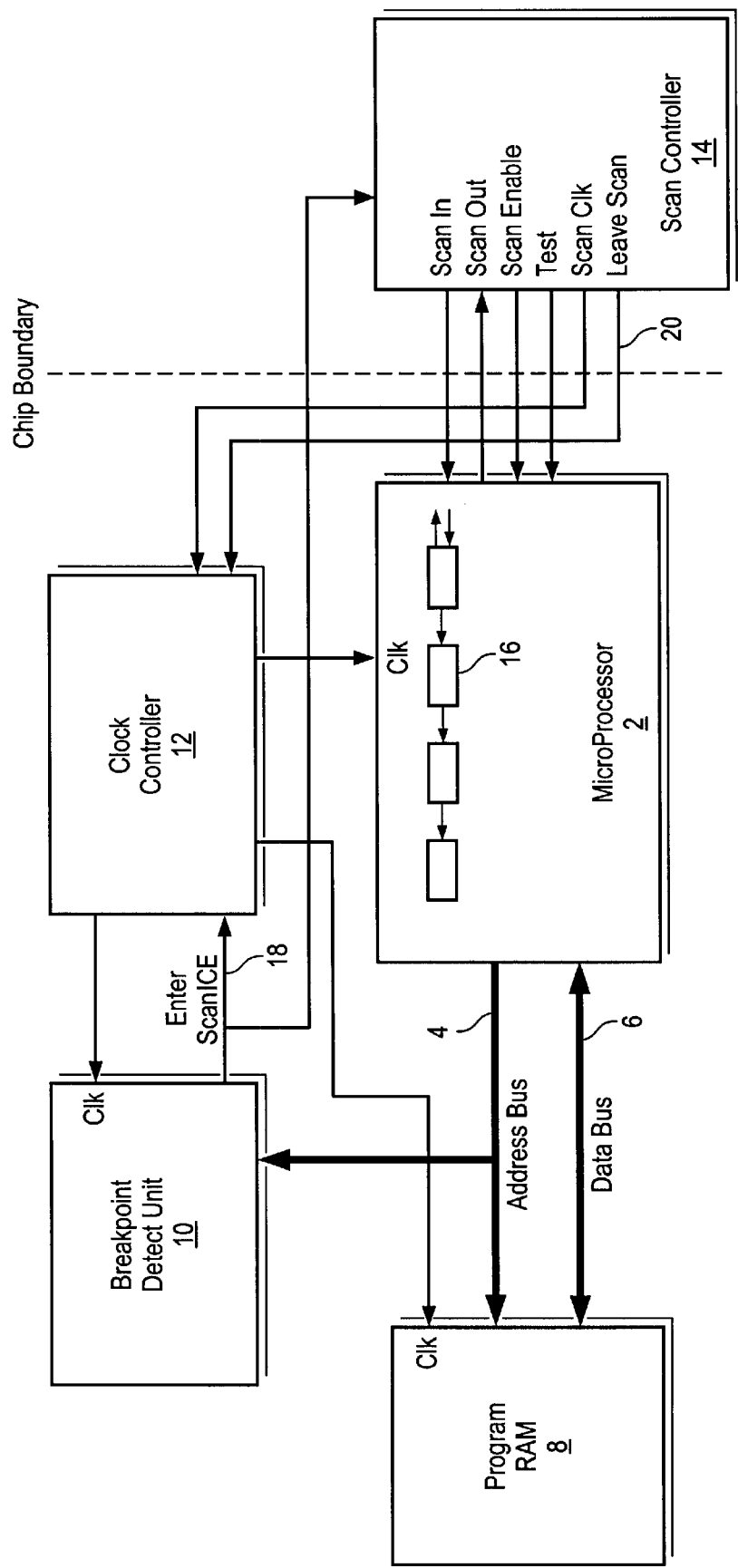
FIG. 1 is a block diagram of a prior approach for entering In Circuit Emulation mode.
Figure 3:
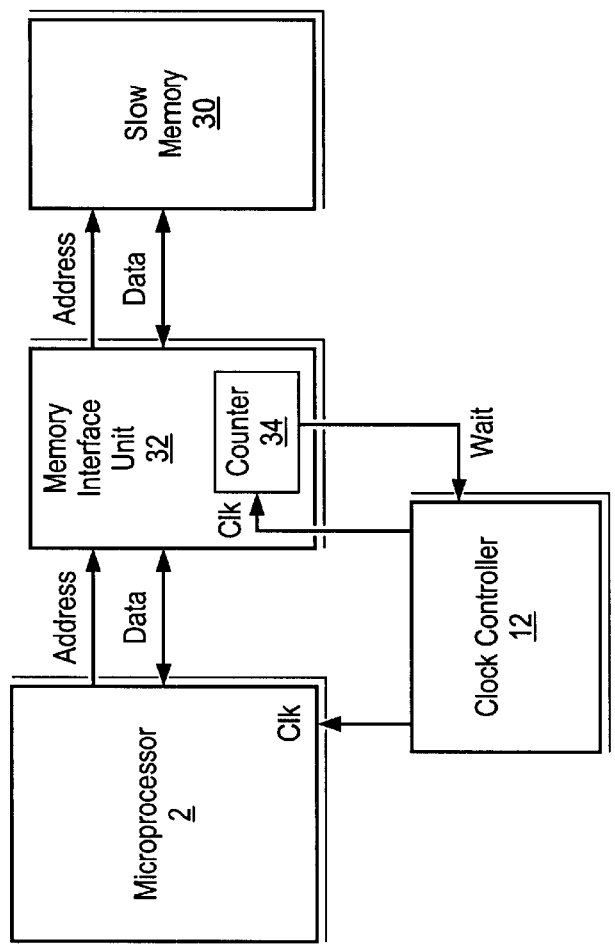
FIG. 3 is an example of a known technique of accessing slow operation memory.
Figure 2:
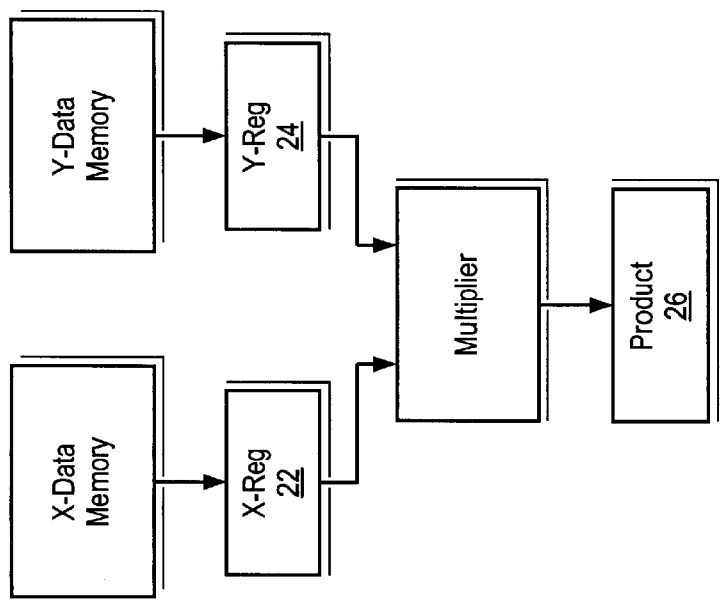
FIG. 2 is a flow chart of a known method of operation of pipelined instructions.
Figure 4:
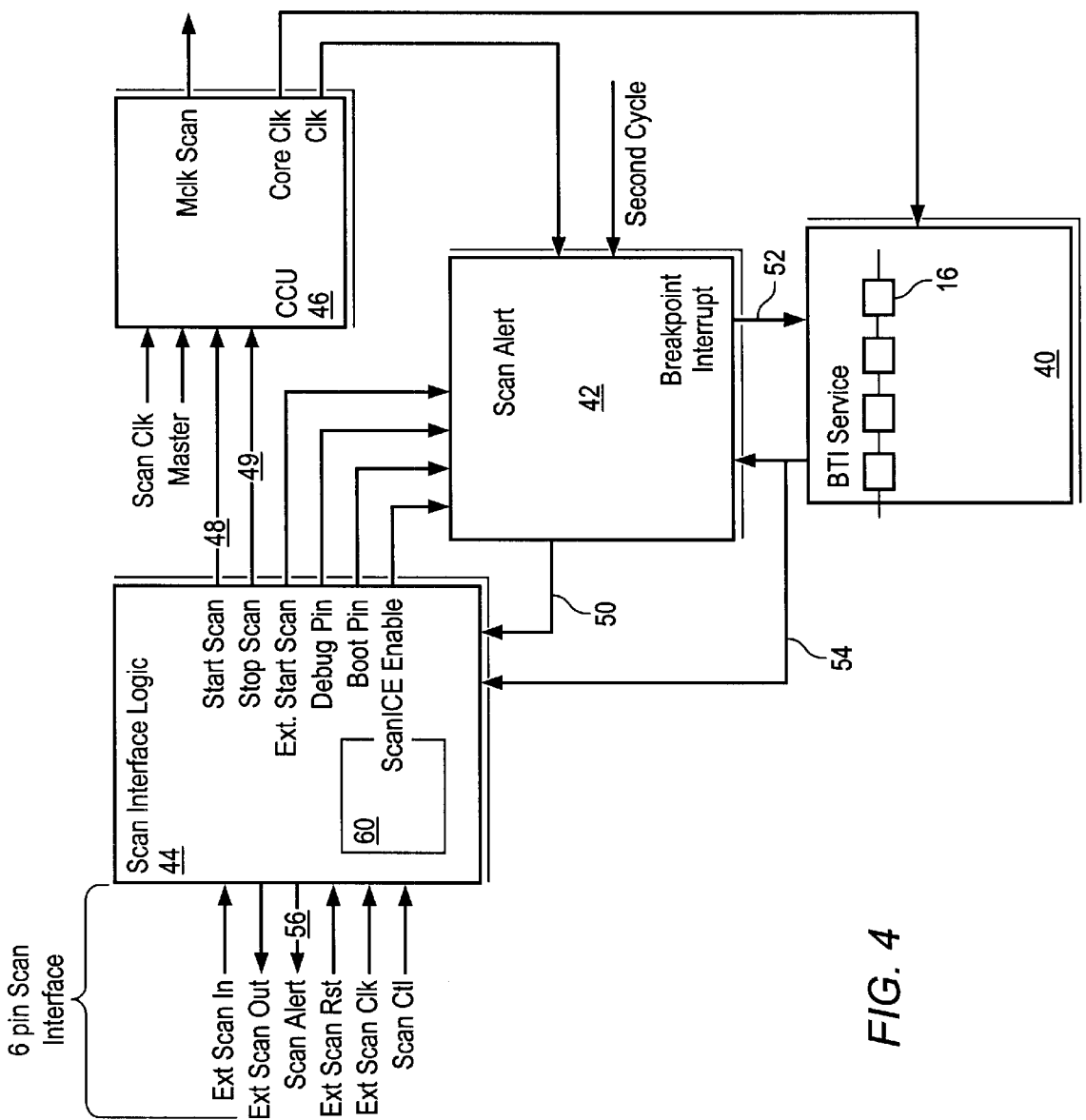
FIG. 4 is a block diagram of a preferred embodiment of the invention.

A preferred embodiment will now be described with reference to FIG. 4. In FIG. 4, a core 40 of a processor is shown, comprising a pipelined DSP processor and including a production scan chain of scan registers 16. In this embodiment, the scan registers are formed from existing registers in the processor by coupling a respective multiplexer to the input of the register to permit either the normal operation of the register or to use it in the scan mode wherein test logic values are loaded into the register. All processors, have a mechanism for "interrupting" the flow of instructions. The instigation of the interrupt can take numerous forms including processor input signals and software instructions. Typically, when an interrupt is received, the current instruction being executed is completed and the processor branches to an Interrupt Service Vector (ISV), a dedicated area of memory that determines the appropriate course of action. It is usual for a branch instruction to be located at, the ISV to an Interrupt Service Routine (ISR) that contains the interrupt handler. At the end of the ISR is some form of RETurn-from-Interrupt (RETI) instruction that indicates the end of the interrupt service routine and causes the program to resume operation from the point where the interrupt occurred. Processor 40 has one particular interrupt instruction suitable for breakpoint implementation, Breakpoint Interrupt BI/TRAP, that can be instigated via an external input (BI) or a software instruction (TRAP). The following actions occur on the Core when a BI/TRAP is received.

Stack Pointer→Stack Pointer -1
Program Counter→Stack
<ISV Address>0x0002>→Program Counter (forces branch to ISV)
Interrupt Acknowledge signal asserted It is seen that the program counter is stored on the stack, for use at the end of the ISR.

The processor has a dedicated module 42 that performs a Breakpoint Detect function. This monitors the activity at core 40 and determines when program execution should be halted and the state of the core communicated to an off-chip debugger. The module 42 uses the BI/TRAP interrupt to stop the operation of the core 40.

The action of interrupting the processor using a Breakpoint with an appropriate ISV achieves two important goals:

1. The clock can be stopped during the execution of a known instruction (the Breakpoint ISV);

2. Following the ScanICE service, the state of the processor can be restored by executing a RETurn from Interrupt.

Good values for the ISV are clearly No-Operations (NOP). If the ISV is mapped to zero wait-stated program memory, these NOPs can be simply loaded into the appropriate memory locations otherwise they can be forced into the instruction pipeline using dedicated hardware inside or outside the core. By stopping the clock following the execution of a sufficient numbers of NOPs, the program pipeline is cleared and the state of the data pipeline is guaranteed to represent the last program instruction.

Figure 7:
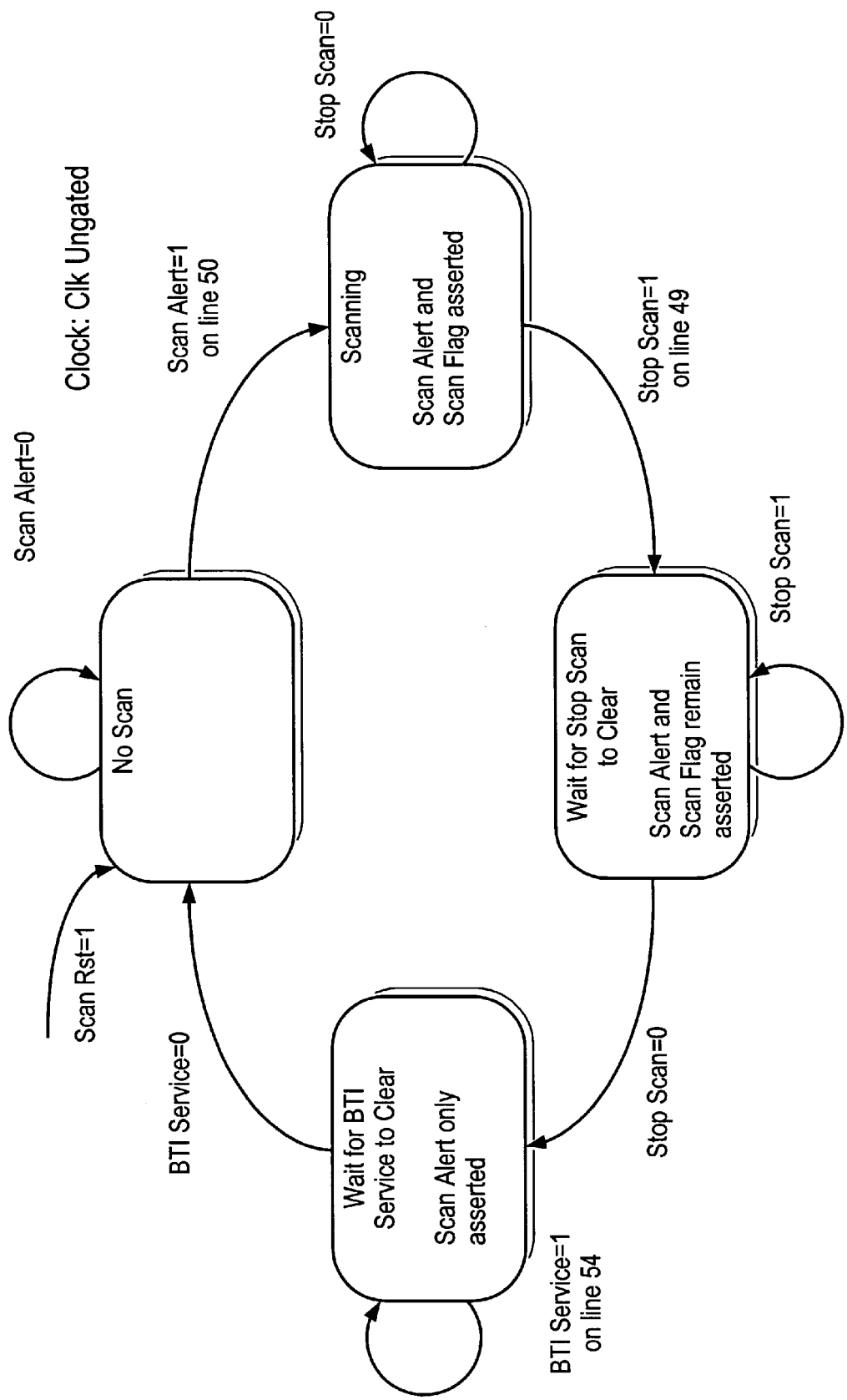
FIG. 7 is a state diagram of a Finite State Machine in the Scan Interface Logic of FIG. 4.

In FIG. 4, a scan interface logic 44 and a Clock Control Unit (CCU) 46 are provided. Logic 44 is coupled to the CCU 46 by various control lines, including a Start Scan signal line 48, and all Stop Scan signal on line 49. Scan Interface Logic 44 also provides control signals to an external scan controller (not shown), including a Scan Alert signal on line 56. The operation of Scan Interface 44 is determined by a Finite State Machine 60, the state diagram of which is shown in FIG. 7.

In operation, the sequence of events is as follows

1. When the module 42 either detects a breakpoint or is instructed to stop program execution by the Scan Interface 44, it asserts a Breakpoint Interrupt input on line 52 to the core 40.

2. The core completes its current instruction and then branches to the BI/TRAP ISV where NOPs are either read or forced into the instruction pipeline. BTI Service is asserted at this time by the Core on line 54 to module 42 and Scan Interface 44.

3. When the module 42 detects BTI Service being asserted (and is configured in ScanICE debug mode) it asserts module Scan Alert on line 50 to Scan Interface 44.

4. The Scan Interface 44 is triggered by the assertion of module Scan Alert to begin entry to ScanICE mode. A key part of this is the assertion of Start Scan on line 48.

5. The CCU 46 detects the assertion of Start Scan and cleanly stops the appropriate clocks (including the clock to the Core).

6. Finally, the Scan Interface 44 asserts one of the 6 Scan Interface signals, Scan Alert, on line 56 to indicate to the off-chip Scan Controller that the clocks have been stopped and it should take control. The Master clock is replaced by Ext Scan Clk (another of the signals in the 6 pin Scan Interface) as the source for the clock signals.

Figure 5:
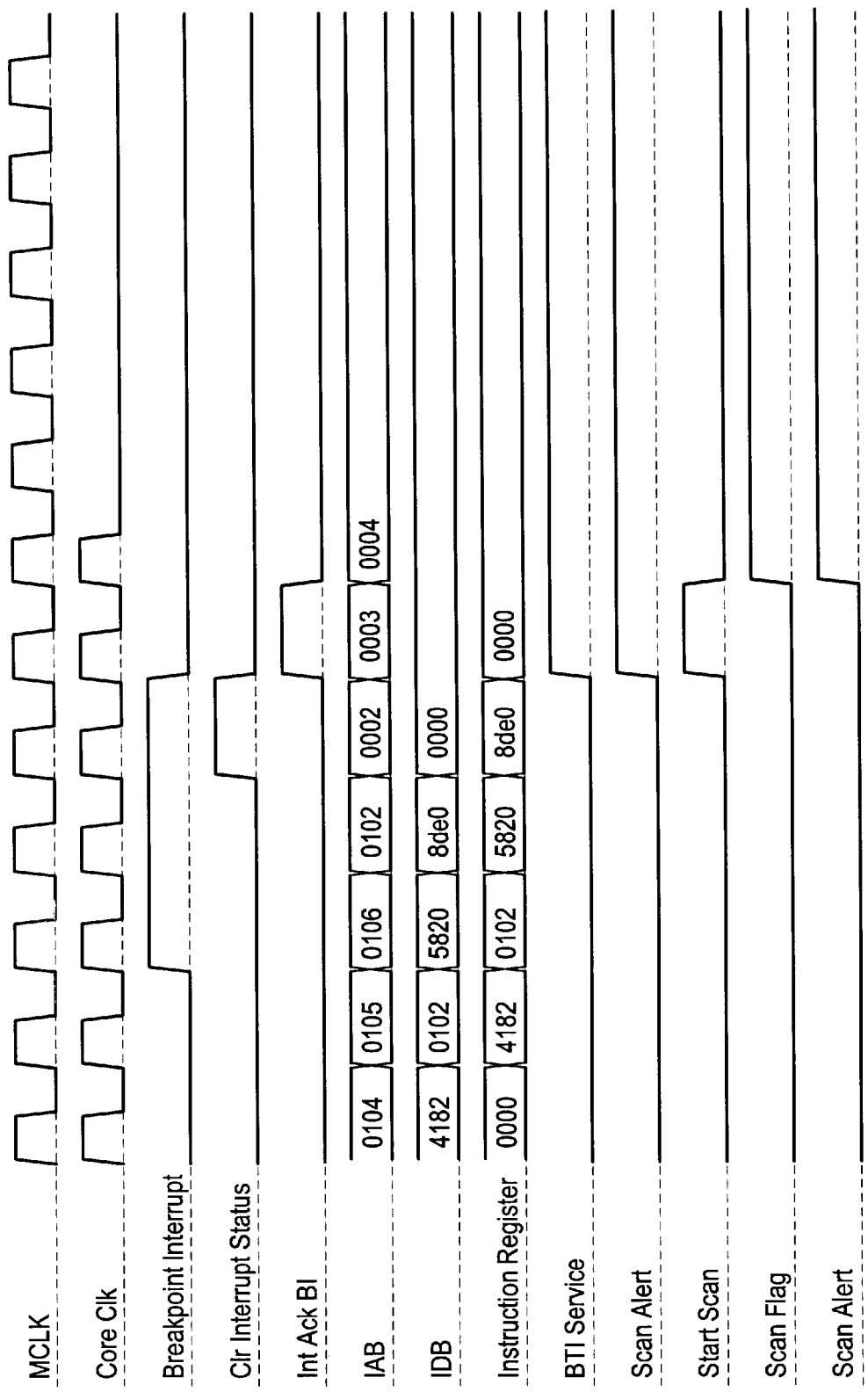
FIGS. 5 and 6 are timing diagrams of the operation of the embodiment of FIG. 4 for entering and leaving an ICE mode.

A timing diagram illustrating this protocol is included in FIG. 5. Scan Flag is used internally to indicate ScanICE servicing in progress.

In FIG. 5, Clr Interrupt Service refers to the core decoder detecting an interrupt request and having completed decoding the previous instruction, it drives the appropriate control signals to service an interrupt. To indicate this special decode function and thus signal the start of the interrupt service routine, Clr Interrupt Service is asserted for one cycle.

IAB Instruction address bus—to/from program RAM;

IDB: Instruction data bus—to/from program RAM;

It may be seen from FIG. 5 that 3 machine cycles following assertion of Breakpoint Interrupt on line 52, BTI Service on line 54 and module scan alert on line 50 are asserted. The data on!IDB bus is zero after 2 machine cycles, with a NOP instruction (0004) on the IAB after 4 cycles. The Scan Alert signal on line 56 is asserted one cycle after BTI Service.

Exit from ScanICE is instigated by serially-loading a RETI instruction into the microprocessor's instruction register during the final full-scan and an appropriate instruction into the Scan Interface Logic's control register. The Scan Interface Logic instigates restarting of the microprocessor's clock, thus executing the RETI instruction and returning to normal program operation. It is clearly important that during the final full-scan when the RETI instruction is loaded, the state of the core is updated correctly. This may simply involve reloading all registers with the values they held prior to entering ScanICE, or with new values as determined by the debugger.

Figure 6:
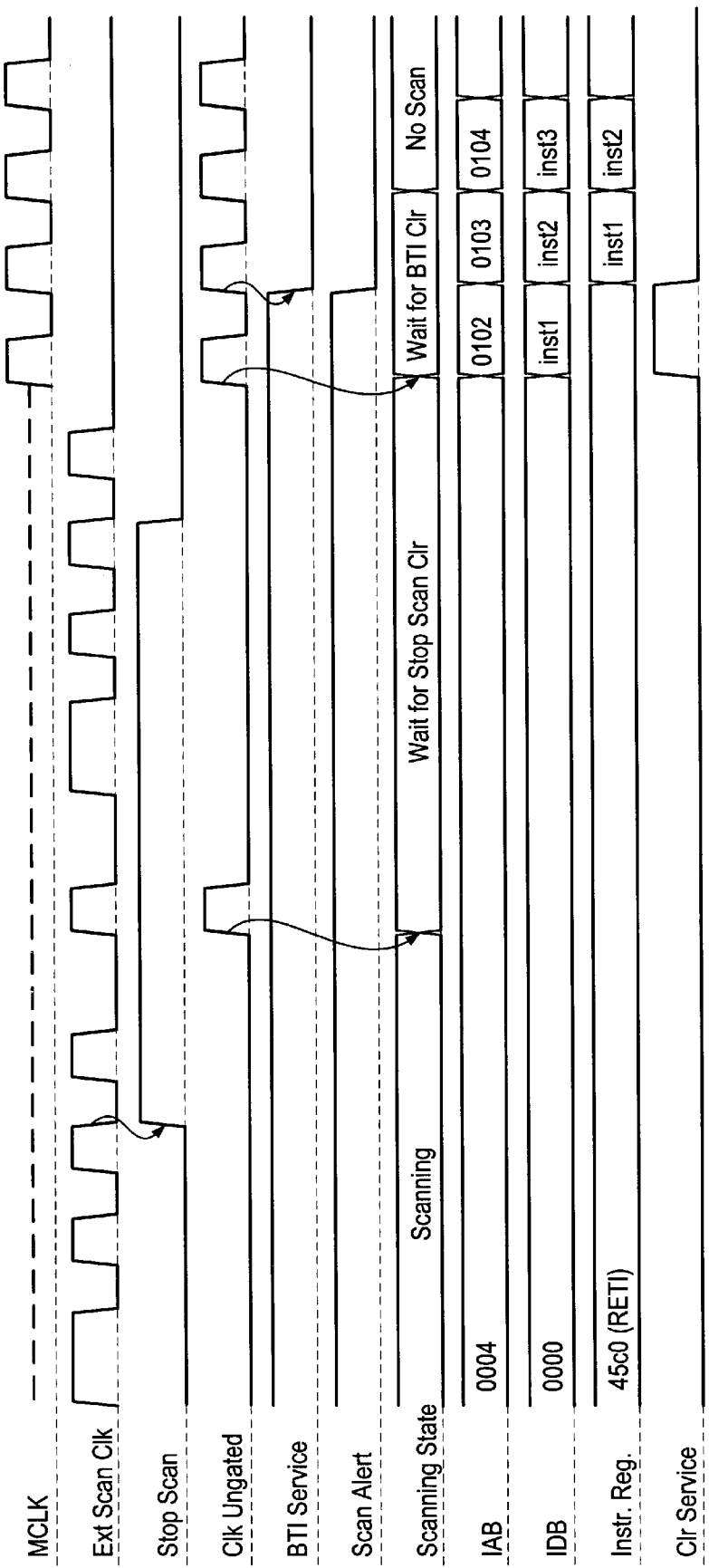

One of the bits in the Scan Interface Logic instruction register is asserted to force exit from ScanICE mode. This "Ctl Stop Scan" bit causes the Stop Scan signal from the Scan Interface to be asserted, and triggers the CCU to restart the stopped clocks. The first instruction that must be executed is a RETurn-from-Interrupt that restores the state of the processor. This is forced into the instruction pipeline by asserting the appropriate bits (45c0) during the final full-scan. The instruction register is effectively loaded directly via the scan-chain. A second timing diagram illustrating the protocol for leaving ScanICE mode is depicted in FIG. 6. An important feature of the protocol for leaving ScanICE is the requirement that Stop Scan on line 49 is cleared before the clocks are restarted. This ensures clean operation if a breakpoint is required immediately after leaving scan (e.g. single-stepping). The extra Ext Scan Clk required during the assertion of Stop Scan is needed in the CCU to register the changing value of the Stop Scan. Following clearance of Stop Scan on line 49, BTI service on line 54 is cleared when the first instruction Instl is present on the core 40.

In the implementation of ScanICE, the protocols for entering and leaving scan are controlled by a Finite State Machine (FSM) 60 in the Scan Interface Logic 44. The state-diagram is illustrated in FIG. 7 and clarifies the operation discussed above.

A principal advantage of this method is to enable clean entry and exit to and from ScanICE mode. The alternative of simply stopping the clock leads to highly complex problems to correctly recover the programming model from the microprocessor's registers. The method also prevents the potentially destructive effects of halting access to off-core memories and peripherals.

What is claimed is:

1. Apparatus for carrying out debugging procedures on a processor, the processor including a chain of scan registers, scan interface means for interfacing with a scan controller means external of the processor, a breakpoint interrupt means for executing an interrupt instruction, and a processor clock control means wherein, when, in the operation of the microprocessor a breakpoint is detected or generated, the breakpoint interrupt means executes an interrupt, the microprocessor completes its current instruction and then branches to an Interrupt Service Vector, the completion of which is signalled to the scan interface means which provides a Start Scan signal to the clock control means, following which the scan interface means signals the external scan controller to begin a scanning operation.

2. Apparatus according to claim 1, wherein the processor includes a pipeline, and the breakpoint interrupt means includes means for filling the pipeline with no operation (NOP) instructions.

3. Apparatus according to claim 1, wherein the processor comprises a DSP processor core.

4. Apparatus according to claim 1, wherein said scan interface means includes a finite state machine for controlling the logical state of the scan interface means.

5. Apparatus according to claim 1, including a signal line connecting the processor to the breakpoint interrupt means and scan interface means for asserting a breakpoint condition.

6. Apparatus according to claim 1, including a signal line connecting said scan interface means to said clock control means for asserting a Stop Scan signal.

7. Apparatus according to claim 5 or claim 6, wherein when the processor exits from the scanning mode, the stop scan signal is asserted while the processor returns to normal operation, at which time the breakpoint condition signal is cleared.

8. Apparatus according to claim 1, wherein one or more scan registers have a respective multiplexer coupled to the input whereby to permit use of the register in the normal operation of the processor or use in a debugging procedure.

9. A method for carrying out debugging procedures on a processor, the method comprising the following steps:

a. providing a processor with a chain of scan registers, a scan interface means for interfacing with an external scan controller means, a breakpoint interrupt means for executing an interrupt instruction, and a processor clock control means;

b. detecting or generating a breakpoint in the operation of the processor;

c. the breakpoint interrupt means executes an interrupt instruction as a result of which the processor completes its current instruction, and signals the same to the scan interface means;

d. the scan interface means asserts a Start Scan signal to the clock control means, which whereupon stops the processor clock or clocks; and e. the external scan controller means is alerted to start a scan sequence.

10. A method according to claim 9, wherein in step c) following execution of the current instruction, a processor pipeline is filled with no operation (NOP) instructions.

11. A method according to claim 9, wherein when the scan sequence is to be terminated, a stop scan signal is asserted to the clock control means by the scan interface means, and a return from interrupt instruction is executed, the processor signalling return to normal operation to said scan interface means.

* * * * *